United States Patent
Bogdanov et al.

(10) Patent No.: US 6,845,661 B2
(45) Date of Patent: Jan. 25, 2005

(54) LEAD FRAME FOR AUTOMOTIVE ELECTRONICS

(75) Inventors: Leon Bogdanov, Troy, MI (US); Ralph J. Ross, Wixom, MI (US); Richard W. Caron, Canton, MI (US); Edward P. McLeskey, Whitmore Lake, MI (US); Eric C. Myers, Howell, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 105 days.

(21) Appl. No.: 10/269,232

(22) Filed: Oct. 11, 2002

(65) Prior Publication Data

US 2004/0069060 A1 Apr. 15, 2004

(51) Int. Cl.⁷ .................................................. G01F 1/68
(52) U.S. Cl. .................................................. 73/204.22
(58) Field of Search .................. 73/204.22, 204.21, 73/204.26, 204.11, 202, 202.5

(56) References Cited

U.S. PATENT DOCUMENTS

| | | | | |
|---|---|---|---|---|
| 4,641,418 A | * | 2/1987 | Meddles | 264/272.17 |
| 4,911,008 A | * | 3/1990 | Casey | 73/202.5 |
| 5,563,340 A | * | 10/1996 | Clowater et al. | 73/202.5 |
| 5,756,893 A | * | 5/1998 | Kondo et al. | 73/204.22 |
| 6,182,639 B1 | | 2/2001 | Igarashi et al. | |
| 6,185,998 B1 | | 2/2001 | Yonezawa et al. | |
| 6,240,775 B1 | * | 6/2001 | Uramachi et al. | 73/204.21 |
| 6,336,361 B1 | * | 1/2002 | Uramachi et al. | 73/204.22 |
| 2002/0078744 A1 | | 6/2002 | Gehman et al. | |

FOREIGN PATENT DOCUMENTS

| | | | |
|---|---|---|---|
| EP | 0 313 089 | 4/1989 | |
| EP | 0 323 694 | 7/1989 | |
| EP | 0 735 349 | 10/1996 | |
| GB | 2 316 750 | 3/1998 | |
| JP | 60230020 A | * 11/1985 | G01F/1/68 |

* cited by examiner

*Primary Examiner*—Edward Lefkowitz
*Assistant Examiner*—Corey D. Mack
(74) *Attorney, Agent, or Firm*—Brinks Hofer Gilson & Lione

(57) ABSTRACT

A device for detecting a mass of a flowing fluid is disclosed. The device includes a housing having a fluid sampling portion and a circuit cavity portion. The fluid sampling portion is positionable within a fluid carrying duct and includes a flow passage. A nozzle is in fluid communication with the flow passage, wherein the nozzle has a nozzle exit. An electrical element is disposed in the flow passage proximate to the nozzle exit. Further, a circuit module is in communication with the electrical element and disposed in the circuit cavity portion for detecting a change in an electrical property of the electrical element, wherein the detected change in the electrical property is used to determine the mass of the flowing fluid. Finally, a homogenous lead frame having a connector pin portion and an electrical attachment portion for providing an electrical path from the electrical element and circuit module to the connector pin portion is provided.

27 Claims, 15 Drawing Sheets

SECTION A-A

SECTION B-B

LEAD FRAME FOR AUTOMOTIVE ELECTRONICS

TECHNICAL FIELD

The present invention relates to electronic components having conductive lead frames for communicating electrical signals to and from electronic components, such as integrated circuits and resistive elements.

BACKGROUND

Conventionally lead frames that carry electrical signals, from various electronic components are made from two different conductive materials. For example, a stainless steel material is used in portions of the lead frame exposed to corrosive air flow environments while the connector pin portions of lead frames are made from copper.

However, significant problems have been observed with lead frames made from these materials. For example, the ductility of copper makes the pins more susceptible to bending. Further, the process for forming the lead frame out of two different materials is costly.

Therefore, a need exists for a new and improved lead frame that is corrosion resistant as well as structurally stable. Moreover, the new and improved lead frame should be less costly than conventional lead frames.

SUMMARY

In an embodiment of the present invention, a mass fluid flow sensor is provided for determining the amount of air inducted into an internal combustion engine, in accordance with the present invention. The mass fluid flow sensor of the present invention includes an external intake air temperature element which improves the accuracy of the mass air reading. An external cold wire element is further provided which improves response time. The mass fluid flow sensor of the present invention has an improved aerodynamic design which provides a lower system pressure drop. A molded one-piece isolated jet nozzle having a hot element disposed therein is provided in a tubular flow passage of the sampling portion of the housing. Consequently, an improved lower internal flow passage pressure drop is achieved. Additionally, an improved signal to noise ratio, as well as a larger dynamic range is an advantageous consequence of the present invention. Further, a homogenous lead frame is provided for communicating electrical signals to and from electronic components, such as integrated circuits and resistive elements In an embodiment of the present invention, a homogenous lead frame made of stainless steel is provided.

In another embodiment of the present invention, control electronics are located in a longitudinally extending section of the mass fluid flow sensor housing above the sampling portion. Thus, the present invention provides an integrated circuit cavity and sampling portion in one package.

In another aspect of the present invention, a U-shaped flow passage is provided having one constant radius bend r for capturing a sample of the intake air.

In yet another embodiment of the present invention, an outlet of the U-shaped flow passage is provided to allow the fluid to exit and flow out of the bottom of the flow passage, as well as, the sides of the housing.

In yet another embodiment of the present invention, a measuring element is located within the flow passage at the exit or outlet of the jet nozzle, in accordance with the present invention.

In yet another aspect of the present invention, the measuring element is centered at the exit of the converging nozzle.

In still another embodiment of the present invention, the control electronics are located adjacent the flow passage within the circuit cavity.

Further objects, features and advantages of the invention will become apparent from consideration of the following description and the appended claims when taken in connection with the accompanying drawings.

DETAILED DESCRIPTION OF THE PREFERRED EMBODIMENT

Figure 1:
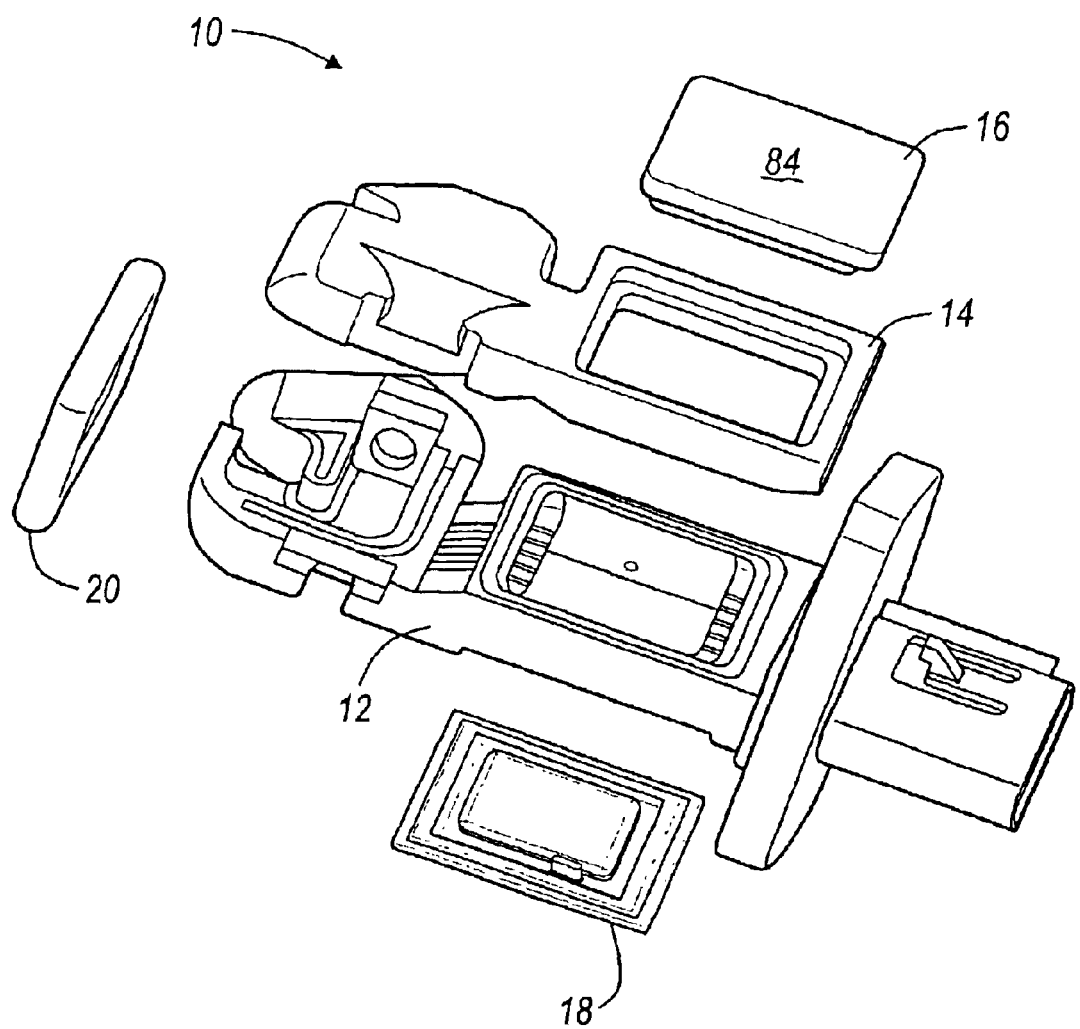
FIG. 1 is an exploded view of a mass fluid flow sensor in accordance with the present invention.
Figure 2:
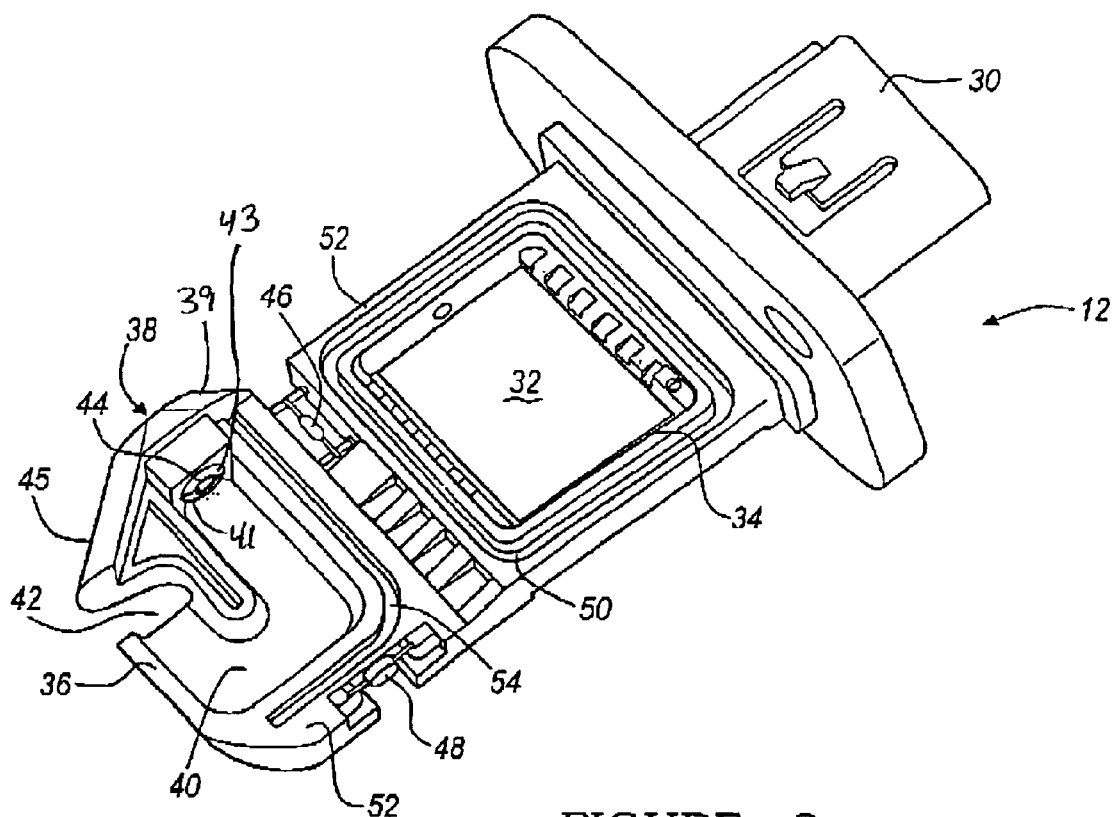
FIG. 2 is a perspective view of a mass fluid flow housing in accordance with the present invention.

Referring now to FIGS. 1 and 2, exploded and perspective views of a mass fluid flow sensor 10 for calculating the amount of fluid flowing in a duct is illustrated, in accordance with the present invention. One application or use for sensor 10 is for measuring the amount of air inducted into an internal combustion engine (not shown). However, the present invention contemplates other uses and application for sensor 10. For example, sensor 10 may be used to calculate the amount of fluid (other than air) flowing through a duct (other than an air intake duct of an internal combustion engine). Mass fluid flow sensor 10 includes a housing 12, housing cover 14, a secondary housing cover 16, an electronics cover 18, and a gasket 20.

Housing 12 includes an integral connector 30 having connector terminals (not shown) that are in electrical communication with engine operation control electronics external to mass fluid flow sensor 10 and in electrical communication with a circuit module 32 disposed within a central housing portion 34. Adjacent to central housing portion 34, housing 12 further provides an integrally attached fluid sampling portion 36. Fluid sampling portion 36 includes an inlet 38 that opens into a nozzle 39. Nozzle 39 communicates with a substantially U-shaped flow passage 40. U-shaped flow passage 40 terminates at an outlet 42.

Nozzle 39 has, generally, a jet nozzle configuration or shape. As will be further illustrated and described, nozzle 39 is defined by a generally circular opening or inlet 38 that meets longitudinally converging elliptical side surfaces (as shown in FIG. 7b). The longitudinally converging elliptical side surfaces of the nozzle create a relatively high pressure at an exit 41 of nozzle 39. Further, the jet nozzle configuration of nozzle 39 creates a critical area 43 located at exit 41 having a uniform fluid flow velocity across the critical area. This critical area created by the nozzle provides enhanced fluid flow detection and measurement as will be described hereinafter. To further enhance the flow of fluid through passage 40 a wedge deflector 45 is positioned on an end of housing 12 upstream of outlet 42. Wedge deflector 45 has a surface that is tilted to create an advantageously low pressure area adjacent outlet 42. If the angle of the surface of deflector 45 (indicated by the letter α in FIG. 7b) is too small with respect to the direction of fluid flow an insufficient pressure drop is created at outlet 42. Conversely, if the angle of the surface of deflector 45 is too large with respect to the direction of fluid flow an insufficient pressure drop is created at outlet 42. Preferably, the angle α of the surface of deflector 45 is between 47° and 60° with respect to a horizontal line.

As illustrated in FIG. 2, a plurality of resistive elements are operatively disposed and supported by housing 12 and are in electrical communication with circuit module 32 via electrical conductors, such as integrally molded leads or terminals. The resistive elements include a hot wire element 44, a cold wire element 46 and an internal fluid temperature (IAT) element 48. Generally, these elements change resistance as a function of temperature.

Circuit module 32 senses a fluid, such as, air flowing through passage 40 by monitoring the power dissipated by the elements. Circuit module 32 may be a single integrated circuit chip or a substrate having discrete, as well as, integrated circuits mounted thereon. The sensed resistance change in the elements is converted to an output signal that is received by the electronic engine control system (not shown). Typically, the electronic engine control system regulates the quantity of fuel injected into the engine by controlling the air to fuel ratio.

The IAT or element 48 is generally a thermistor or similar device. Element 48 is located on housing 12 to insure an accurate reading of the temperature of the air charge during the induction cycle of the internal combustion engine. As shown in FIG. 2, element 48 is located, preferably, external of passage 40 to minimize the fluid heating effects caused by the heat dissipation from hot element 44.

In a preferred embodiment of the present invention, a fluid flow sensor 10 is provided having elements 44 and 46 made of platinum wire wound resistors. Generally, these elements have a positive temperature coefficient. Thus, any resistive changes in the elements will correspond with a temperature change in the same direction. That is, if the temperature increases, the resistance will increase, and if the temperature decreases, the resistance will decrease. Preferably, hot element 44 is located at exit 41 of nozzle 39 and within the critical area 43. The location of the hot element within the critical area insures that fluid, having a uniform velocity profile, flows over the hot element causing heat to dissipate from the entire surface of the element. Thus, the present invention provides enhanced fluid flow detection.

In an embodiment of the present invention, hot element 44 may for example have a resistance of 20 Ohms at 21.1° C. Thus, if the temperature increases by −17.2° C. the resistance of the hot wire will increase by approximately 0.025 Ohms. The hot element 44 is used primarily for detecting the velocity of the fluid flowing through passage 40 from which the mass of fluid flowing through passage 40 may be derived.

The cold wire element 46, may for example have a nominal resistance of 500 Ohms at 21.1° C. If the temperature of the cold wire is increase by −17.2° C. the resistance of cold wire will increase by approximately 0.5 Ohms. The primary purpose of the cold wire element 46 is to provide temperature correction.

Figure 3:
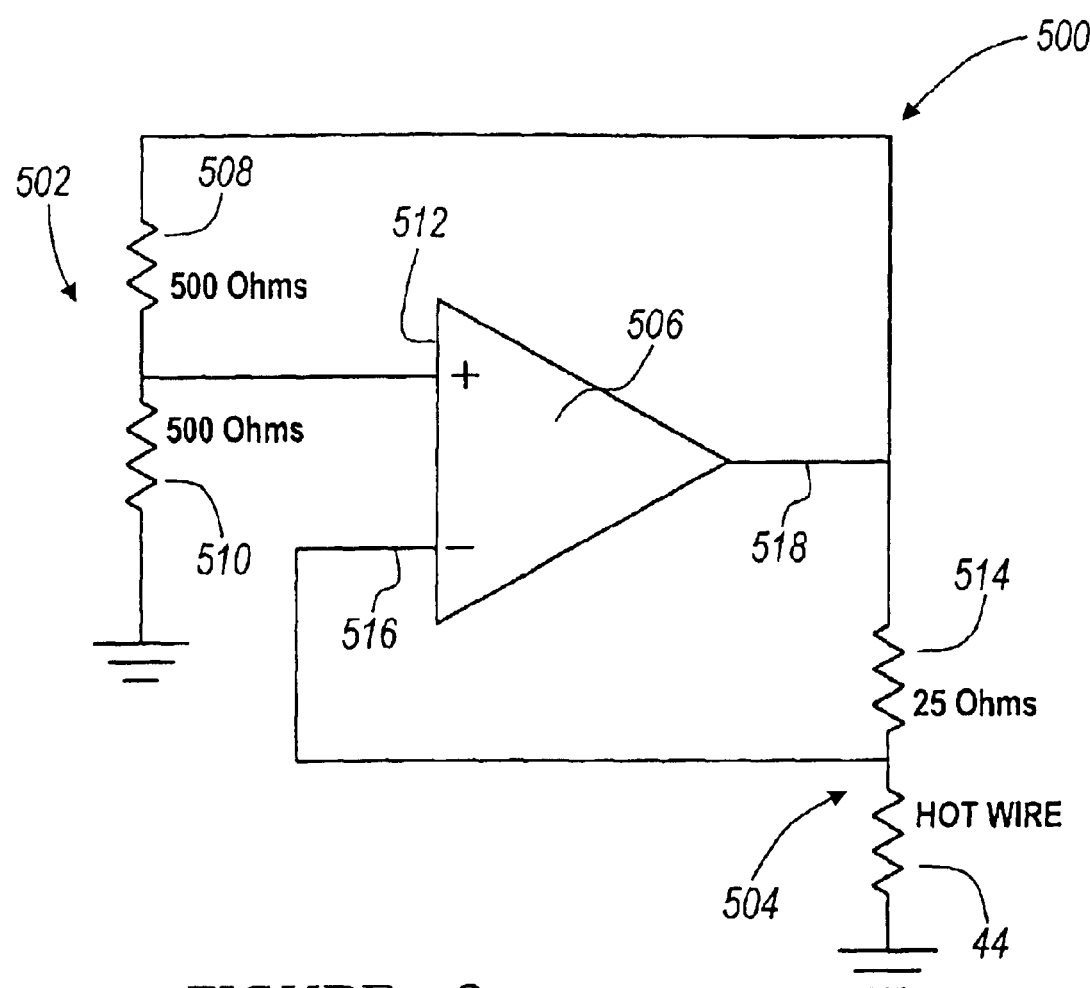
FIG. 3 is a perspective view of a mass fluid flow housing cover, in accordance with the present invention.

In operation hot wire element 44 is held at approximately 200° C. above the ambient temperature. This is accomplished by placing the hot wire element in a voltage divider circuit. With reference to FIG. 3, an exemplary voltage divider circuit 500 for fixing hot wire element 44 at a desired constant resistance and temperature is illustrated, in accordance with the present invention. In an embodiment of the present invention circuit 500 is disposed in integrated circuit 32, along with other control circuitry. Exemplary circuit 500 includes two voltage divider networks 502 and 504 in communication with an operational amplifier 506. Voltage divider network 502 generally has two 500 Ohm resistors 508 and 510 which form a 50% voltage divider network and force plus pin 512 of op-amp 506 to half the output voltage on line 518. The other voltage divider network 504 includes generally a 25 Ohm resistor 514 in series with the hot wire element 44. The minus pin 516 of op-amp 506 is connected between resistor 514 and hot wire element 44. Thus the ratio of this network starts with a ratio of 20 Ohms to 45 Ohms, so minus pin 516 is forced to $^{20}/_{45}{}^{th}$ of the output voltage. For example, the op-amps output voltage on output line 518 will increase if the voltage on plus pin 512 is greater than the voltage on the minus pin 516. Likewise, the output voltage on line 518 will decrease if the voltage on plus pin 512 is less than the voltage on minus pin 516. Accordingly, the op-amp's output voltage on line 518 will increase or decrease by a voltage amount necessary to force the voltage on plus pin 512 to equal the voltage on minus pin 516.

Since resistor network 502 provides a greater voltage on plus pin 512 that is 50% of the output voltage as compared to 44% on minus pin 516, the op-amps output voltage will increase on line 518. As the voltage increases, the power dissipated by the hot wire element 44 causes an increase in resistance of the hot element. It takes approximately one quarter watt of power in still air to increase the temperature of hot element 44 by 93.3° C. A 93.3° C. increase in temperature raises hot wire element 44's resistance by 5 Ohms. The ratio of the hot wire resistance at the increased temperature to the total resistance in resistor network 504 forms a 50% voltage divider network. Thus, the plus and minus pins 512 and 516 of op-amp 506 are at the same voltage since both networks 502 and 504 form 50% voltage divider networks. Thus the temperature of hot wire element 44 is forced to approximately 132.2° C.

The circuit 500 provides an output on line 518 to an electronic engine control module (not shown) which determines the proper air fuel ratio for optimal engine operation, as well known in the art. Since it takes a quarter watt as disclosed above for voltages on plus and minus pins 512 and 516 to be equal, the voltage across the hot wire element 44 and resistor 514 can be calculated using the equation: Power=(voltage)$^2$/resistance and then solving for voltage (V): V=(power×resistance)$^{1/2}$ or (0.25×25)$^{1/2}$. Since the voltage across resistors in series add the nominal output of the circuit is 5 volts for no air flow. Obviously, more circuitry would be used to level shift and amplify the output of the circuit 500.

As air flows over hot wire element 44, power in the form of heat is transferred from the hot wire element to the air. Heat removed from the hot wire element 44 causes the resistance of element 44 to decrease. Decreasing resistance causes the voltage applied to the minus pin 516 to decrease. Accordingly, the output voltage on line 518 would increase causing more power to be dissipated by the hot wire element 44. Thus, the increase in power dissipated by the hot wire element causes the temperature of element 44 to increase and return to 132.2° C. When this temperature is reached, the voltage on pins 512 and 516 of op-amp 506 will be at equilibrium.

Accordingly, since the circuit regulates the resistance of hot wire element 44 the output of the circuit on line 518 is proportional to the square root of the power removed from the hot wire times two minus 5 volts, for example. Nominal power dissipated by the hot wire element 44 is one-quarter of a watt which is the amount of power needed to keep the hot wire element 44 at 132.2° C. Any heat removed from the hot wire is replaced by applying more power to element 44. Resistance of the hot wire is regulated to 25 Ohm thus resistance is considered to be constant. Power removed equals the power applied minus the amount needed to maintain the hot wire at 132.2° C. Solving the power formula for voltage: v=(power×resistance)½, any increase in power applied to the hot wire element 44 is also applied to the 25 Ohm resistor. Therefore, the voltage necessary to compensate for power removed from element 44 is doubled.

Figure 8:
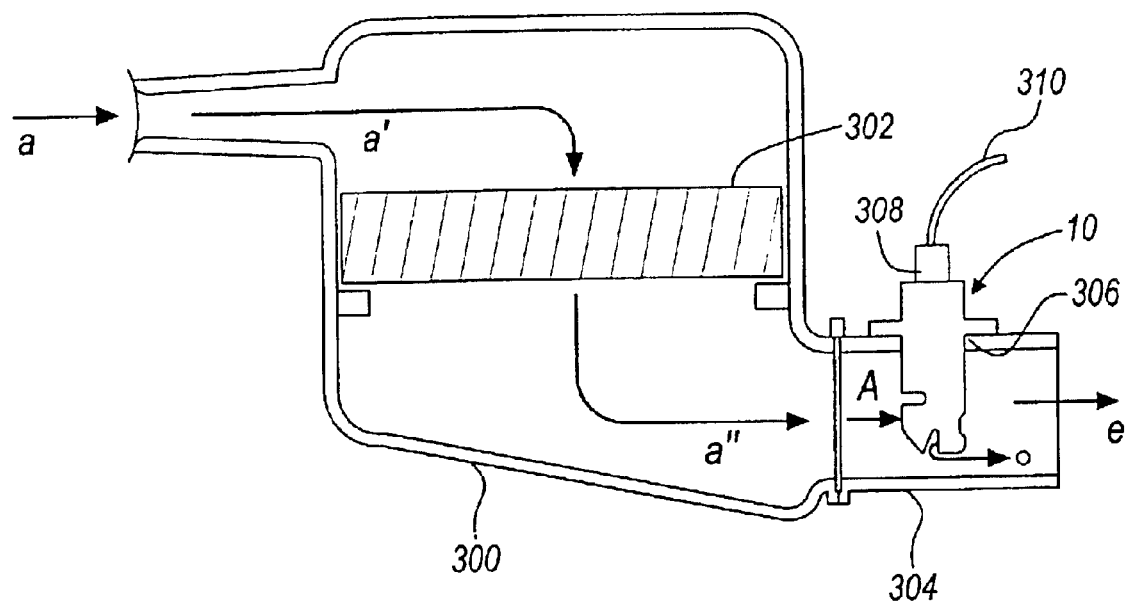
FIG. 8 is cross-sectional view through an automotive fluid intake manifold and further illustrated in exemplary location of the mass fluid flow sensor, in accordance with the present invention.

For proper operation of sensor 10, the temperature of hot wire element 44 needs to be maintained at 200° C. above ambient temperature. If the ambient temperature is constant there is no need for temperature correction. That is, a constant difference in temperature guarantees the same amount of power will be removed from the hot wire element 44 for a given air flow. However, when a fluid flow sensor is placed in an automobile (as shown in FIG. 8), ambient air temperature is not constant. Typically, sensor 10 will be exposed to temperatures below freezing and above boiling. Thus, air flow temperatures lower than expected will cause a larger than desired output voltage and temperatures higher than expected will cause a lower than desired output voltage.

The present invention provides temperature correction to compensate for the variable ambient temperature environment present in an automobile. Temperature correction is achieved through the use of the cold wire element 46. The cold wire element 46 is placed in resistor network 502 in place of resistor 510, as illustrated in FIG. 3. Circuit 500 uses cold wire element 46 for temperature compensation. Element 46 is supported by housing 12 and is placed in the air stream outside of flow passage 40. Placing cold wire element 46 in the air stream allows the circuit to quickly respond to changes in the ambient air temperature. The temperature of cold wire element 46 will follow the temperature changes of the incoming air. Since the resistance of the cold wire element (500 Ohms) is relatively large compared to the voltage drop across the element, the power dissipated is very small. For example, at 21.1° C. the resistance of element 46 is 500 Ohms with a voltage drop of 2.5 volts. Moreover, the power dissipated by element 46 is 0.0125 watts which results in a temperature increase of about −12.2° C.

Accordingly, the resistance of the cold wire element 46 would increase by 5 Ohms and resistor network 502 resistance ratio would change. For example, the voltage applied to plus pins 512 would equal $^{505}/_{1005}$ or 50.25% of the output voltage on line 518. In turn resistor network 504 will also have to form a ratio equal to 50.25% of the output voltage. Thus, to form the same ratio, the hot wire resistance would need to be maintained at 25.25 Ohm to develop the same resistance ratio of 50.25% thus the hot wire element 44 will be maintained at 200° C. above the cold wire element 46 or 137.7° C. if the ambient temperature is 21.1° C. Cold wire element 46 is −12.2° C. above the ambient temperature of 21.1° C. Thus, the temperature difference that is necessary for handling environmental extremes is maintained. The nominal output of this circuit is still five volts. It takes ¼ watt of power to raise the temperature of the hot wire element by 93.3° C. Solving the power equation for current (i), i=(power/resistance)$^{1/2}$. Thus, current in the hot wire network equals 0.099503 amps ((0.25/25)$^{1/2}$). The output voltage is then (0.099503×50.25), which is approximately five volts. The circuit in FIG. 3 can dynamically adjust to ambient air temperature changes because the change in the cold wire network is directly proportional to the properties of the hot wire network.

The values for resistance and changes in resistance are solely for explanatory purposes and other values certainly may be used.

Figure 4A:
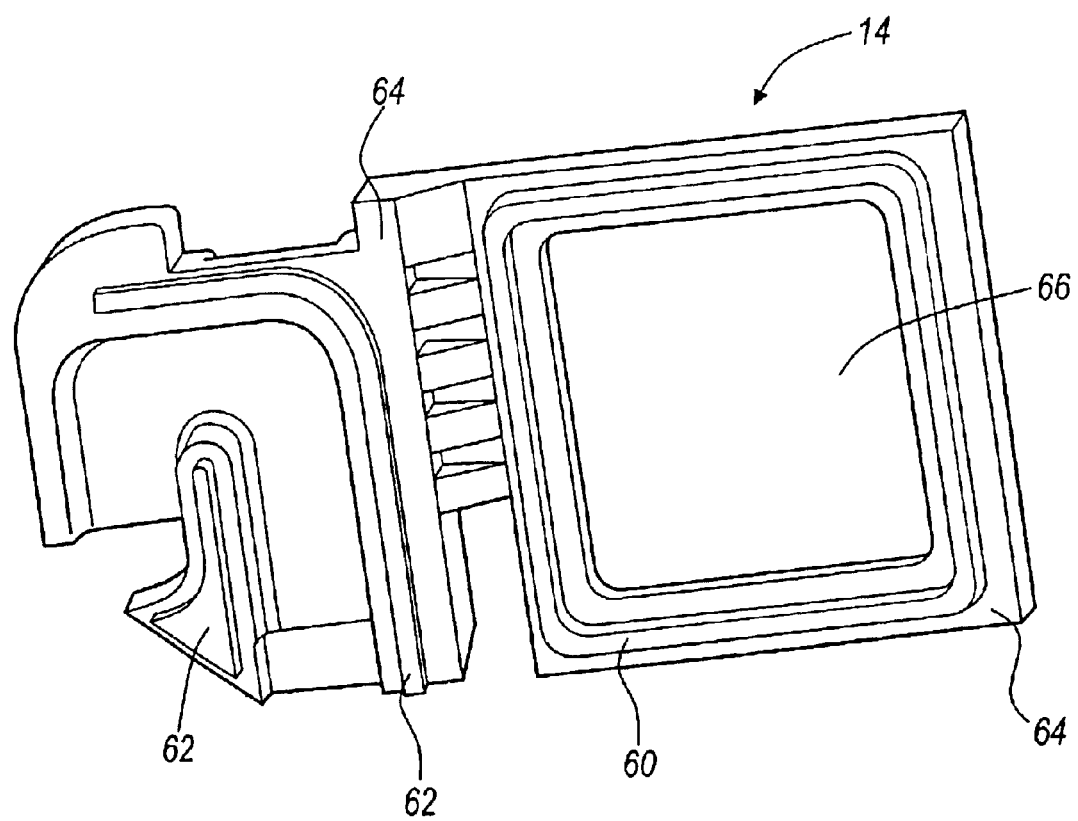
FIG. 4a is an inside perspective view of a mass fluid flow housing cover, in accordance with the present invention.
Figure 4B:
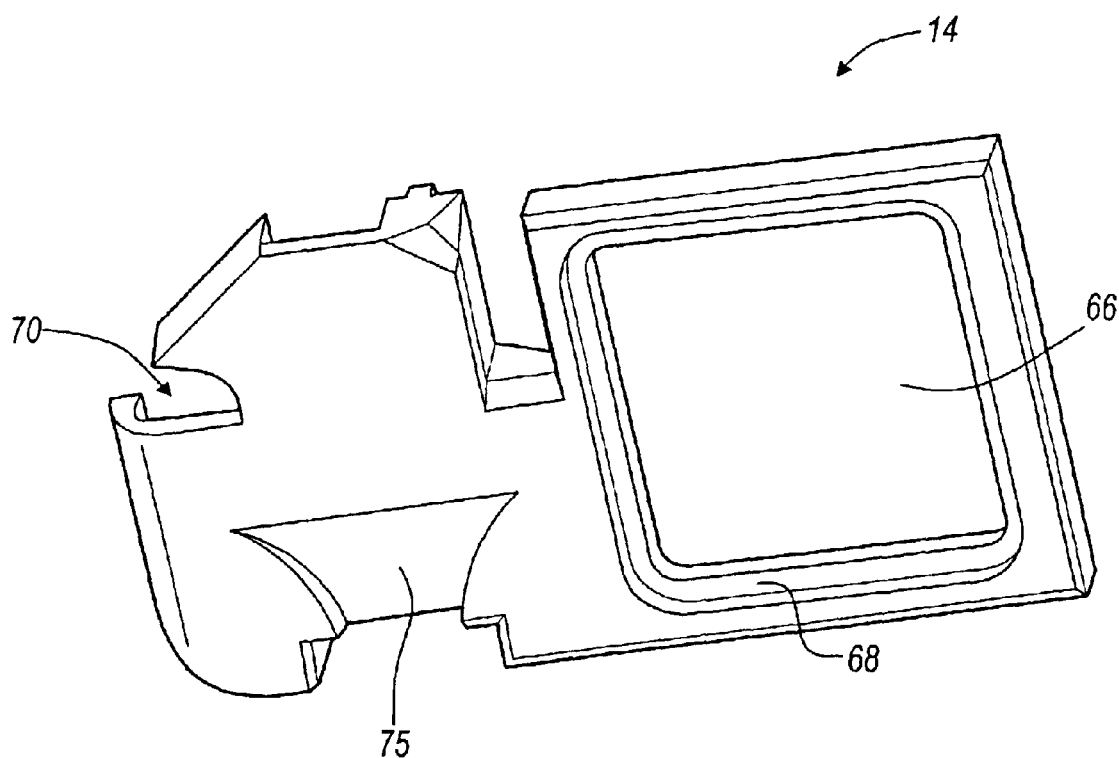
FIG. 4b is an outside perspective view of the housing with the housing cover installed thereon, in accordance with the present invention.
Figure 4C:
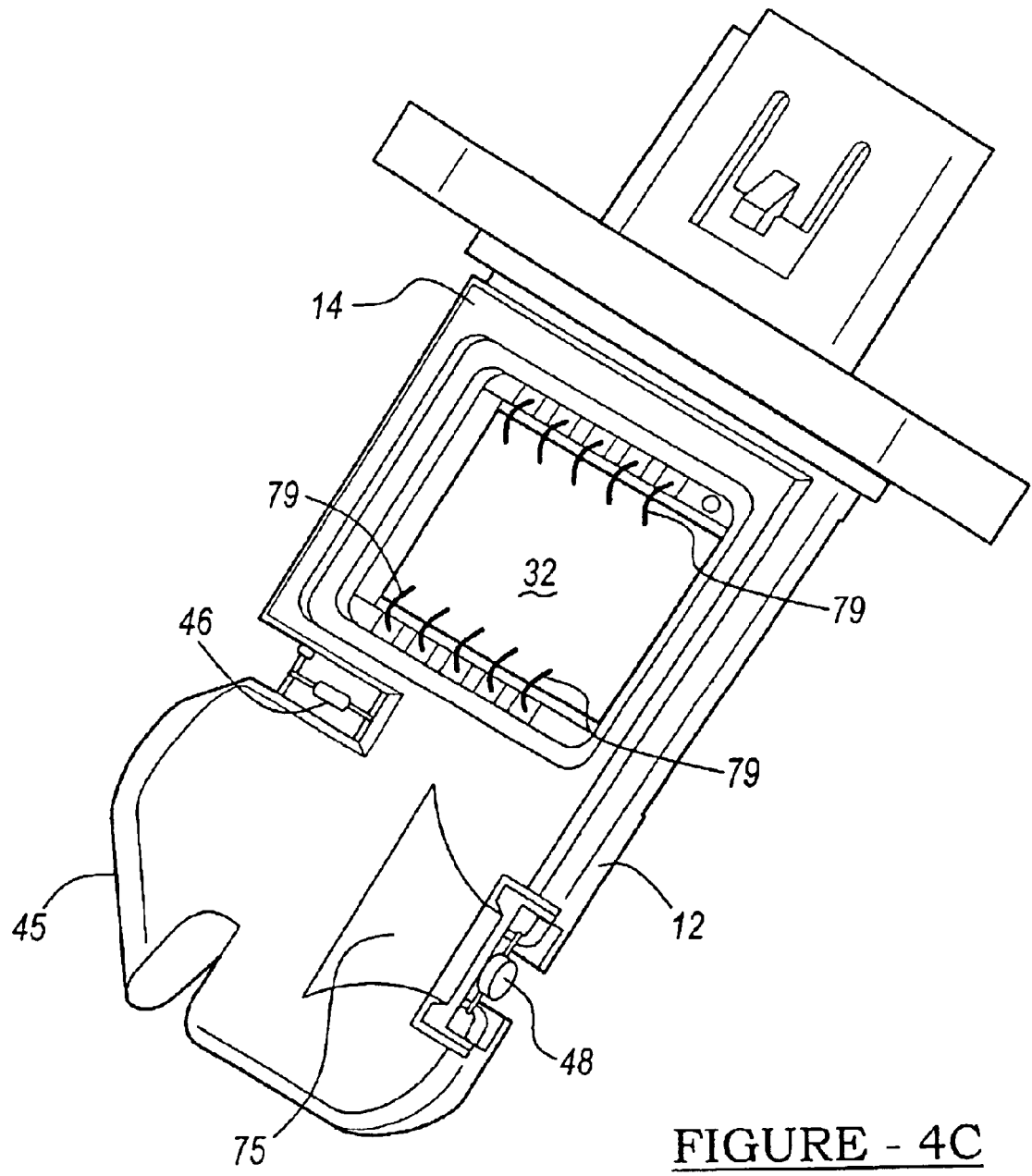
FIG. 4c is a perspective view of the housing with the housing cover installed thereon, in accordance with the present invention.

Referring now to FIGS. 4a and 4b, a perspective view of housing cover 14 is further illustrated, in accordance with the present invention. FIG. 4a is an inside view of housing cover 14 and FIG. 4b is an outside view of housing cover 14. Housing cover 14 is fixedly joined to housing 12 (as shown in FIG. 4c) along a protruding ridge 60 and 62. Ridge 60 protrudes from an inside surface 64 of housing cover 14 and matingly seals with channel 50 disposed on an inside surface 52 of housing 12. Ridge 62, protruding from an inside surface 64 of housing cover 14, matingly seals with channel 54 disposed within surface 52 and around the perimeter of flow passage 40, thus creating an enclosed and sealed flow passage 40. Housing cover 14 further includes a window aperture 66 for providing access, during manufacture, to integrated circuit 32 (as shown in FIG. 4c). For example, window aperture 66 provides access to integrated circuit 32 during the calibration step in the manufacturing process. Further, as shown in FIG. 4c, integrated circuit 32 is wire bonded using wire bonds to various terminal and/or bonding pads disposed on housing 12.

As shown in FIG. 4b a channel 68 is provided around a perimeter of window 66 to matingly seal the secondary housing cover 16 to housing cover 14. Further, a side opening 70 allows air exiting flow passage 40 to flow out of both side surfaces 72 and of cover 14. A ramped portion 75 is included in surface 72 to funnel and direct air passing over the surface toward cold wire element 46

Figure 5:
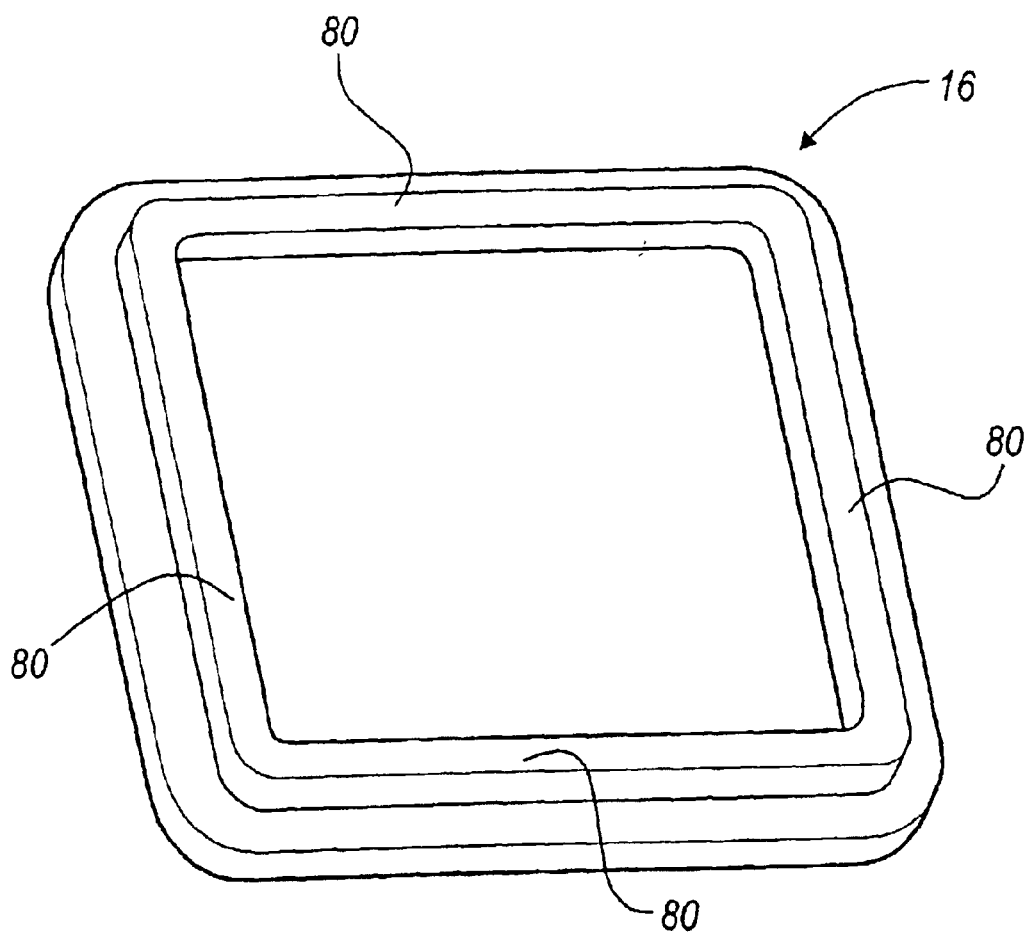
FIG. 5 is a perspective inside view of an electronics cover for a mass fluid flow sensor, in accordance with the present invention.

A perspective inside view of secondary housing cover 16 is illustrated in FIG. 5. Cover 16 includes a perimeter ridge protrusion 80 which matingly seals with housing cover 14 along the perimeter of window 66 and within channel 68. Secondary housing cover 16 is substantially flat and maybe constructed of a heat conductive material, such as a metal for dissipating heat generated by integrated circuit 32. As shown in FIG. 1, secondary housing cover 16 has a generally planar outside surface 84. After cover 16 is positioned on housing cover 14, both the cover 14 and the secondary housing cover 16 create a longitudinally extending and generally planar surface to insure minimal disturbance of the air flowing around sensor 10.

Figure 6:
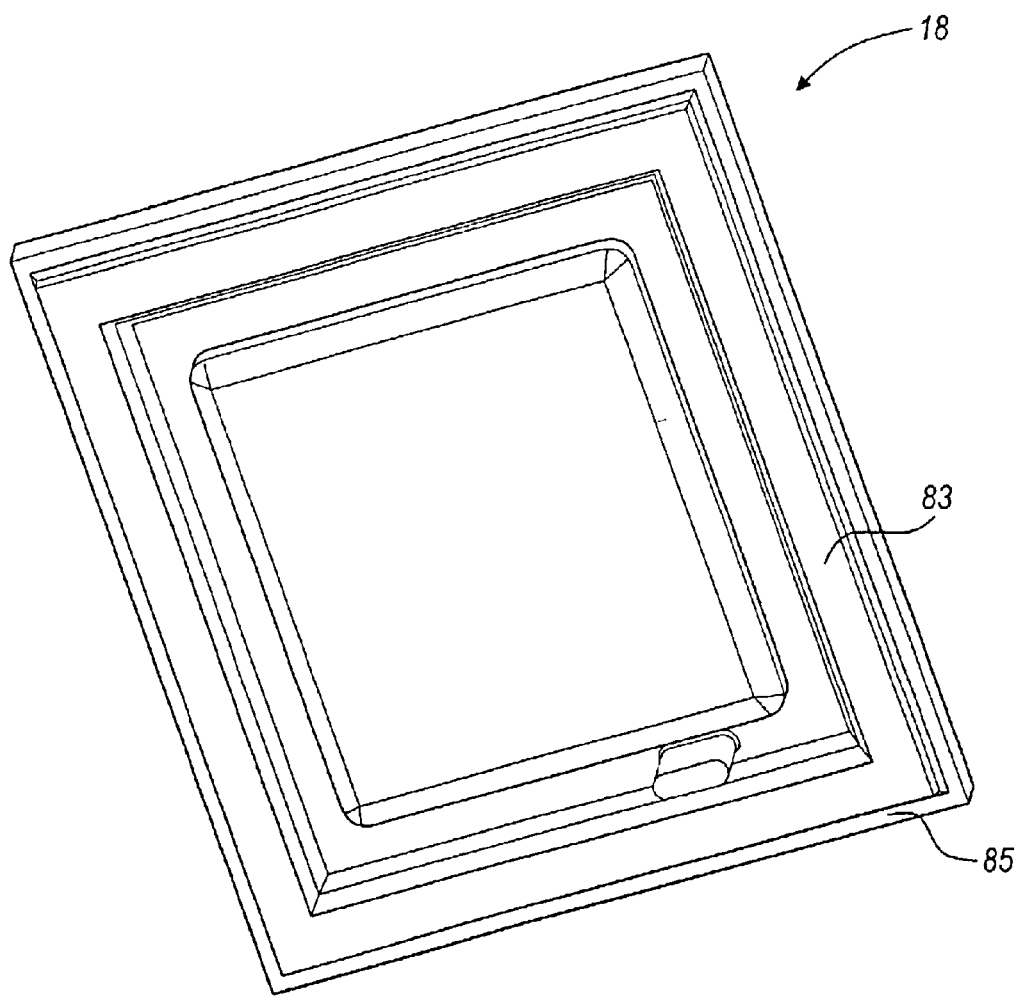
FIG. 6 is an outside view of an electronics cover of a mass fluid flow sensor, in accordance with the present invention.

A perspective inside view of electronics cover 18 is illustrated in FIG. 6. In an embodiment of the present invention integrated circuit 32 is bonded to cover 18 and the resulting circuit and cover assembly is loaded into and matingly seals against housing 12. Cover 18 has a protruding ridge 83 rising from a surface 85 of cover 18. Protruding ridge 83 sealingly mates with a corresponding channel (not shown) disposed on housing 12 to created a weather resistant sensor housing. Preferably, cover 18 functions as a heat sink to draw heat emanating from circuit module 32. In an embodiment of the present invention, heat sink 18 is made from a metallic material or other material having similar thermal conductive properties.

Figure 7A:
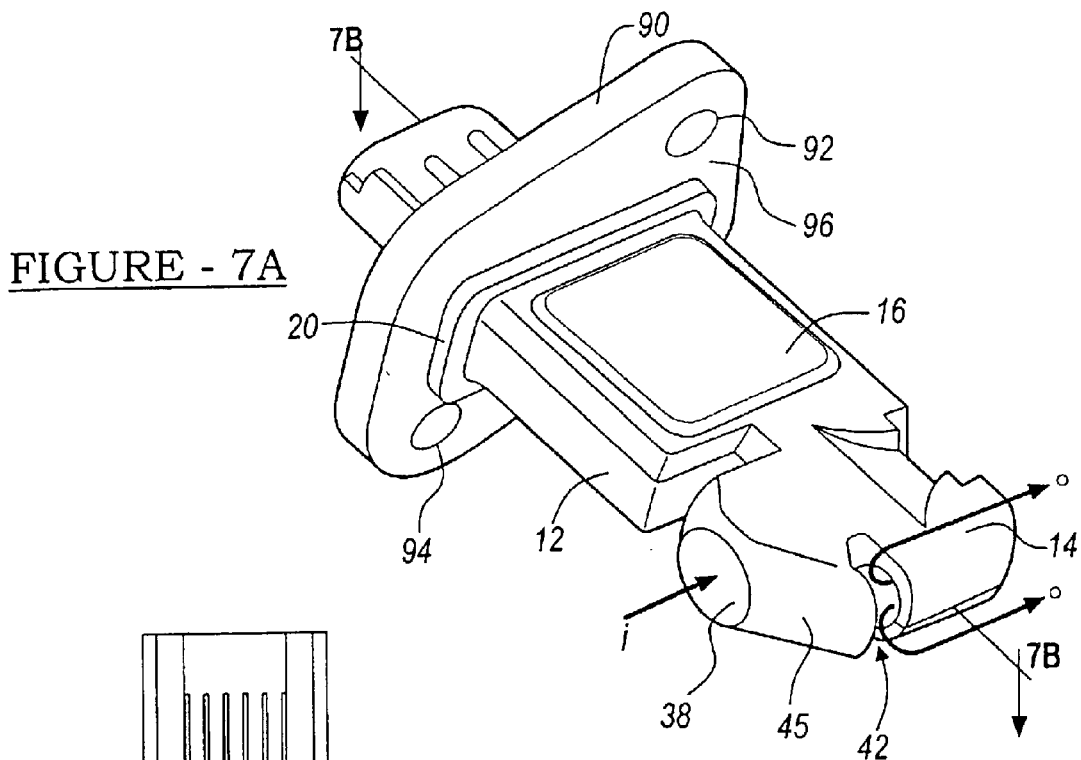
FIG. 7a is a fully assembled perspective view of a mass fluid flow sensor in accordance with the present invention.
Figure 7B:
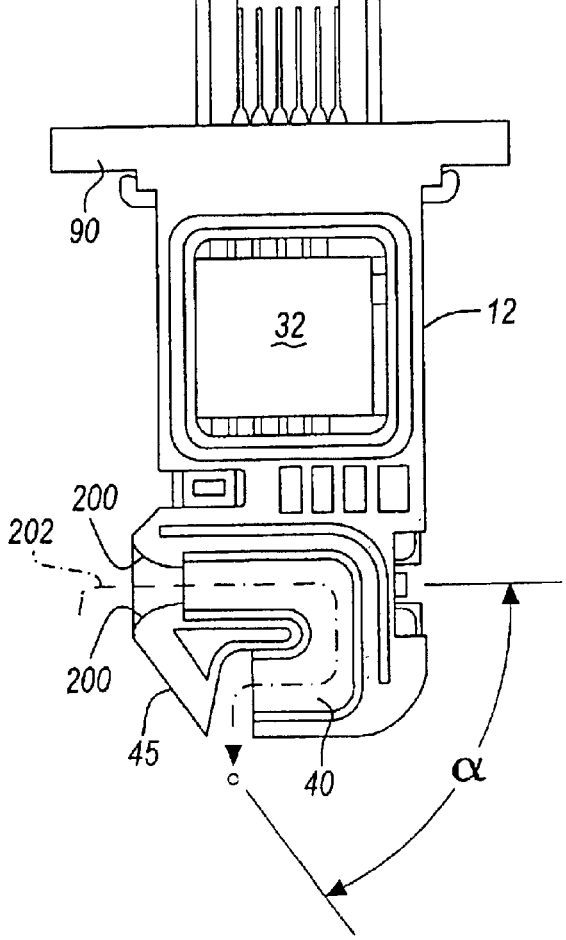
FIG. 7b is a cross-sectional view through the mass fluid flow sensor as indicated in FIG. 7a in accordance with the present invention.

A perspective view of a fully assembled mass fluid flow sensor 10 is illustrated in FIG. 7a, in accordance with the present invention. A flange 90 is integrally formed in housing 12 and includes a plurality of mounting apertures 92 and 94. Mounting apertures 92 and 94 receive fasteners (not shown) such as screws for securing sensor 10 to a mounting surface. Further, flange 90 has a mating surface 96 for matingly engaging an engine air intake duct 304 (shown in FIG. 8) as will be described below. Gasket 20 which is configured to engage a flange ledge or shelf 98 is positioned between the engine intake duct and flange 90 to provide an air tight seal between mass fluid flow sensor 10 and air intake duct 304.

As illustrated in FIG. 7a, air flows into inlet 38 of mass fluid flow sensor 10 in a direction, as indicated by arrow i, and out of outlet 42 in a direction, as indicated by arrows O. Inlet 38 is generally circular and as illustrated in FIG. 7b has a generally elliptical cross-section.

With specific reference to FIG. 7b, elliptical surfaces 200 which define the perimeter of inlet 38 and nozzle 39. Moreover, as shown, elliptical surfaces 200 converge along a longitudinal axis 202, creating an inlet and nozzle having a longitudinally converging elliptical surface. This inlet and nozzle configuration is known as a jet nozzle. Further, it is known that this jet nozzle configuration creates a critical area, at the exit of the nozzle, having a uniform fluid flow velocity. As stated above the present invention has improved accuracy as compared to the prior art because, for example, the hot element 44 is located in the critical are and therefore is evenly cooled by incoming fluid.

Referring now to FIG. 8, an exemplary automotive environment in which a mass fluid flow sensor may be operatively disposed is illustrated, in accordance with the present invention. Typically, an automotive vehicle has an air intake manifold 300 for supplying fresh air to the vehicle's engine (not shown). Generally, air intake manifold 300 includes a filter 302 for filtering the intake air and extract contaminants from the air drawn into manifold 300.

Air intake manifold 300 is typically attached to an air duct 304 for communicating the clean air to the vehicle's engine. As illustrated, mass fluid flow sensor 10 is positioned and fixedly secured to air duct 304 through an aperture 306 in air duct 304. Outside air is drawn into intake manifold 300 in a direction indicated by arrow A and flows through manifold 300 as indicated by arrows A' and A". When the intake air reaches air duct 304, a portion of the intake air flows into the mass air flow sensor, as indicated by arrow i, and then out of the mass fluid flow sensor as indicated by arrow o. All of the intake air eventually exits air duct 304 and enters the vehicle's engine, as indicated by arrow e. Electrical control signals containing information regarding the amount of air flowing through the air duct 304, derived from measurements and processing carried out on integrated circuit 32, is communicated to the vehicle's electronic control systems through a connector 308 and wire harness 310.

The present invention contemplates an assembly and/or manufacturing method or process for constructing mass fluid flow sensor 10. In an initial step the resistive elements are electrically connected to the housing using solder or other like material or other bonding process (i.e. resistance welding). At a next step, the electronics cover 18 and integrated circuit 32 assembly is mounted to the housing 12, using an adhesive or similar material. At a next step, the housing cover 14 is mated to housing 12 and bonded thereto using an adhesive or similar material. At a next step, the assembly is placed in an oven or other environment suitable for curing the adhesive. At a next step, the integrated circuit 32 is wire bonded to terminals and/or bonding pads on housing 12. At a next step, the integrated circuit 32 is calibrated and/or adjusted and/or resistors disposed within circuit 32 are trimmed. At a next step, the secondary housing cover 16 is mated to housing 12 and bonded thereto using an adhesive or similar material. At a final step, sensor 10 is tested to insure proper function at different operating states and environmental conditions.

Referring now to FIG. 9a–e, an alternate embodiment of a mass air flow sensor housing 412 is illustrated, in accordance with the present invention. As in the previous embodiments, housing 412 has a connector end 414 having electrical terminals 415 for communicating electrical signals from the mass air flow sensor to external circuitry (not shown), as illustrated in perspective view of FIG. 9a and in the cross-sectional view of FIG. 9b. Connector end 414 further has a flange 416 that enables housing 412 to be mounted to an air duct 304 of an air intake of an engine (see FIG. 8), for example.

Figure 9A:
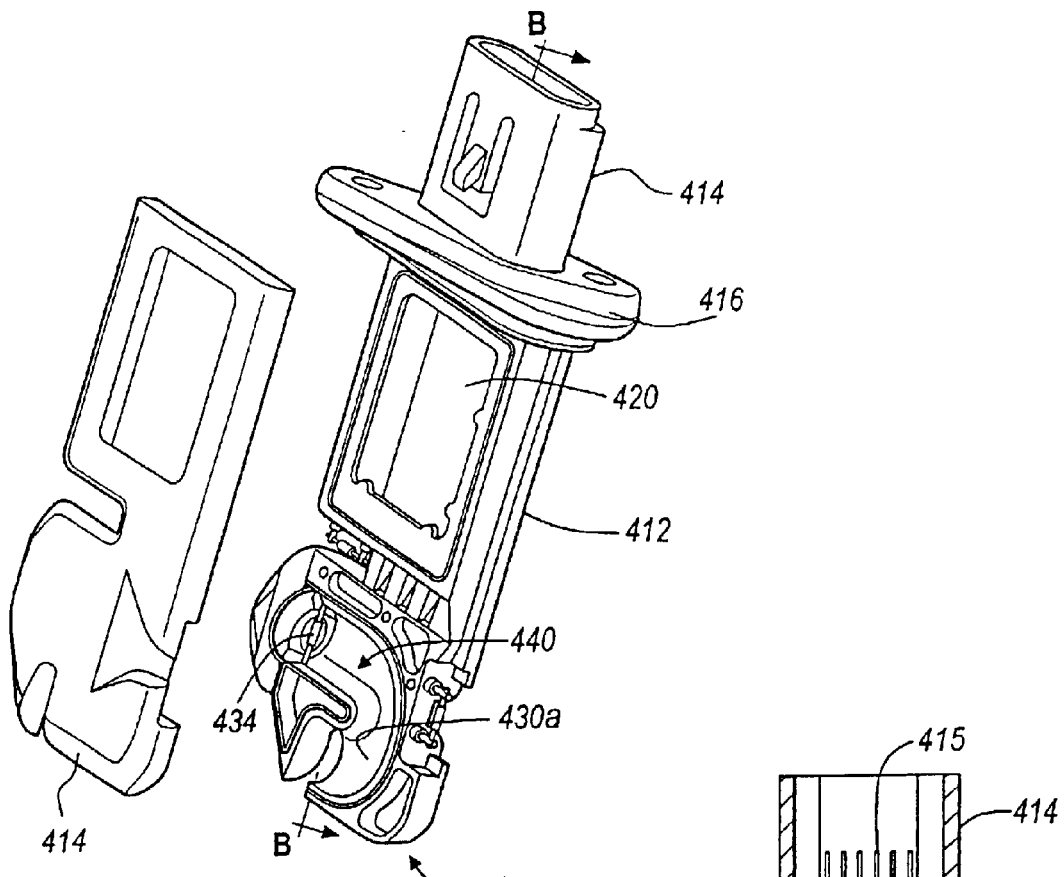
FIGS. 9a–9d are perspective and cross-sectional views through an alternate embodiment of a mass fluid flow sensor, in accordance with the present invention.

Additionally, housing 412 has a central portion 418 and an air sampling end 424. Central portion 419 includes an aperture 420 for receiving a circuit module 422. At air sampling end 424, an air sampling passage 426 is disposed. Air sampling passage 426 includes an inlet 428, a sampling channel 430, and an outlet 432. Sampling channel 430 is in-molded or integrated into air sampling end 424. More specifically, sampling channel 430 has two portions a housing portion 430a and a housing cover portion 430b, as shown in FIGS. 9a and 9c. The housing portion 430a is in-molded or integrated into housing 412 and housing cover portion 430b is in-molded or integrated into housing cover 414. When the housing cover 414 is bonded to housing 412 the two portions, housing portion 430a and housing cover portion 430b mate to form a uniform tubular sampling channel 430.

To further enhance the flow of fluid through channel 430 a wedge deflector 445 is positioned on an end of housing 412 upstream of outlet 442. Wedge deflector 445 has a surface that is tilted (with respect to a horizontal) to create an advantageously low pressure area adjacent outlet 432. If the angle of the surface of deflector 445 (indicated by the letter $\alpha$ in FIG. 9b) is too small with respect to the direction of fluid flow an insufficient pressure drop is created at outlet 432. Conversely, if the angle of the surface of deflector 445 is too large with respect to the direction of fluid flow (and horizontal line h) an insufficient pressure drop is created at outlet 432. Preferably, the angle α of the surface of deflector 445 is between 47° and 60° with respect to the horizontal line h.

In a preferred embodiment channel 430 includes an expansion tube portion 431, a re-directional portion 433 and channel exit portion 435. Expansion tube portion has a length $l_e$ (see FIG. 9e) and extends from the nozzle exit to the entrance of re-directional portion 433. The re-directional portion 433 is semi-circular in shape and extends from the expansion tube portion to the channel exit portion. Further, re-directional portion 433 has an inner wall having a constant inner radius $r_I$ and an outer wall having a constant outer radius $r_o$ (see FIG. 9e). Thus, the present invention provides a sampling channel 430 having reduced turbulent flow.

Disposed within the fluid sampling passage 426 is a thermal sensor 434. Thermal sensor 434 is in communication with circuit module 422 for detection and signal processing of electrical signals indicative of a change in power dissipation of thermal sensor 434. Processed and/or conditioned signals are then communicated through an electrical lead frame to terminals 415 for communication to external circuitry.

Figure 9B:
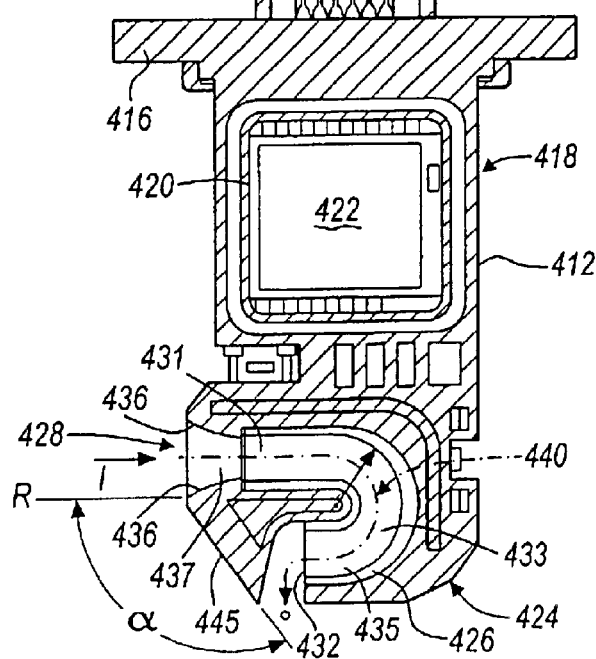
Figure 9C:
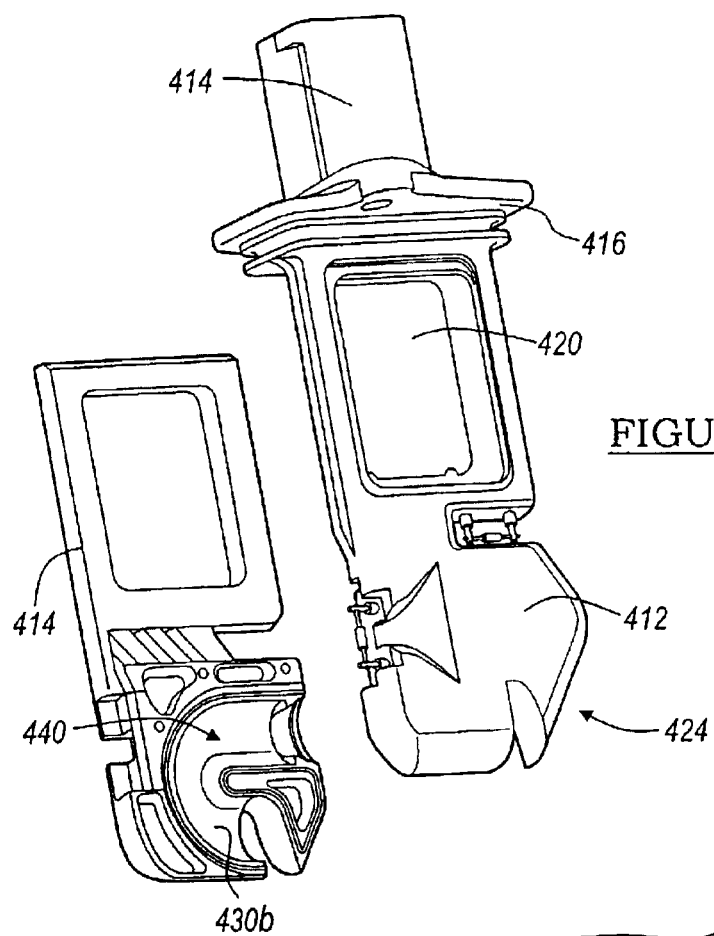
Figure 9D:
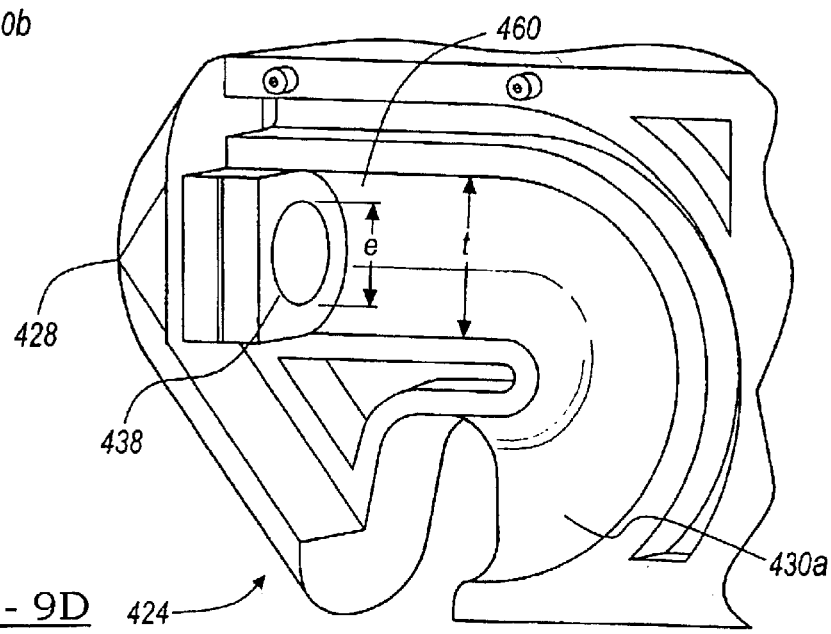

Inlet 428 of fluid sampling passage 426 is configured to have elliptically converging interior surfaces 436 that define a jet nozzle 437, as shown in FIG. 9b. Thermal sensor 434 is positioned at an exit 438 of jet nozzle 437. Again, channel 430 of fluid sampling passage 426 is preferably tubular in shape. Further, the jet nozzle exit 438 has a diameter e that is less than a diameter t of tubular channel 430, as shown in the partial-expanded view of fluid sampling end 424 of FIG. 9d. The different diameters of jet nozzle exit 438 and tubular channel 430 create a transitional section 460 at the interface of nozzle exit 438 and channel 430. A fully annular vortices is created in transitional section 460. Such a controlled fully annular vortices spins within transitional section 460 creating a fluid bearing 502 which extends circumferentially around the nozzle exit 438 (see FIG. 9e). Fluid bearing 502 creates a substantially frictionless area at transitional section 460 that promotes (enhances) fluid flow through sampling channel 430.

Figure 9E:
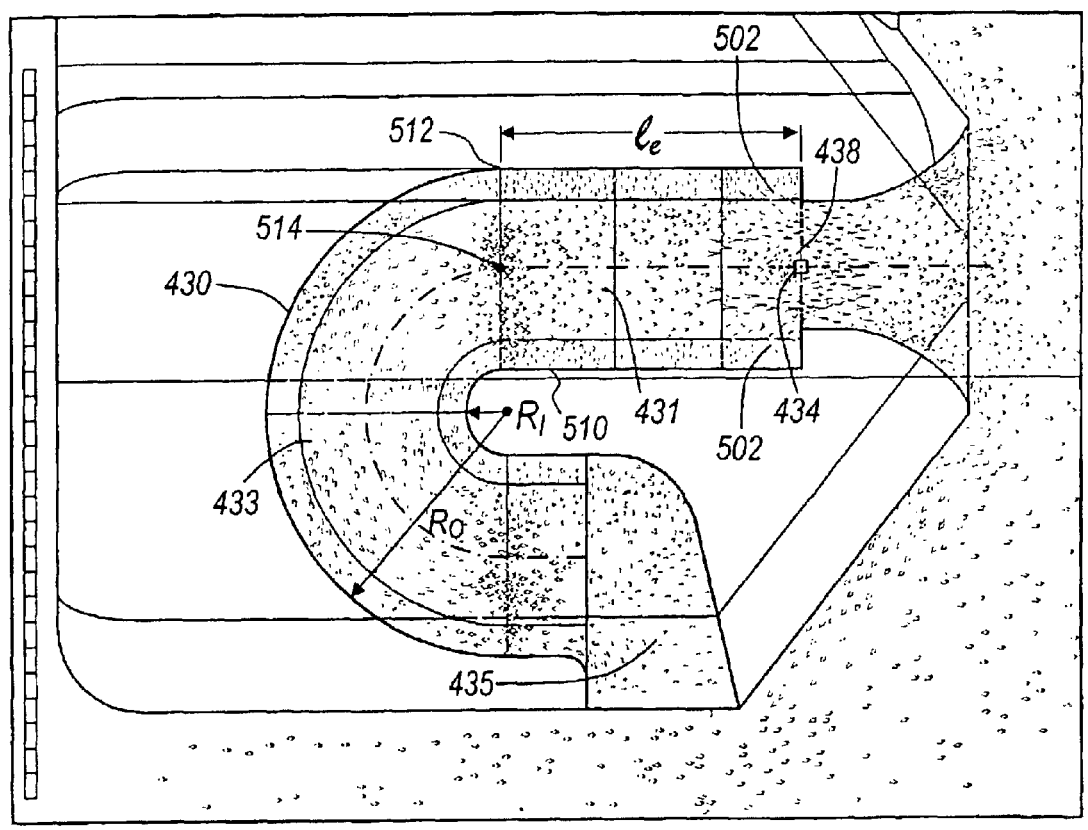
FIG. 9e is a computational fluid dynamics diagram illustrating the fluid flow direction and velocity through the mass fluid flow sensor.

With specific reference to FIG. 9e, a computational fluid dynamics diagram indicating the direction and velocity of fluid flowing through channel 430 is illustrated. As shown, fluid enters inlet 428 and the velocity and pressure of the fluid rises as the fluid moves toward nozzle exit 438. At the transition from the nozzle exit to channel 430 opening the pressure and velocity of the fluid drops dramatically due to the channel diameter t being larger than the diameter e of the nozzle exit (shown in FIG. 9d). As previously stated, channel 430 includes expansion tube portion 431 having an expansion tube length $l_e$. The expansion tube has generally straight walls and runs between nozzle exit 438 and an entrance 514 of re-directional portion 433 of channel 430. The length of the expansion tube is predetermined such that at a maximum fluid flow velocity the fluid contacts or "attaches" to a wall 510 of the expansion tube before reaching an end 512 of expansion tube 431. The Fluid bearing 502 creates a low pressure at nozzle exit 438. Thus, fluid is pulled through the nozzle and into the sampling channel 430 to wall 510 of the channel and prevents fluid from re-circulating backward in the channel. Therefore, the present invention has many benefits over the prior art. For example, the present invention has increased dynamic range, such that the mass fluid flow may be determined at very low fluid intake speeds as well as at very high fluid intake speed.

Figure 10:
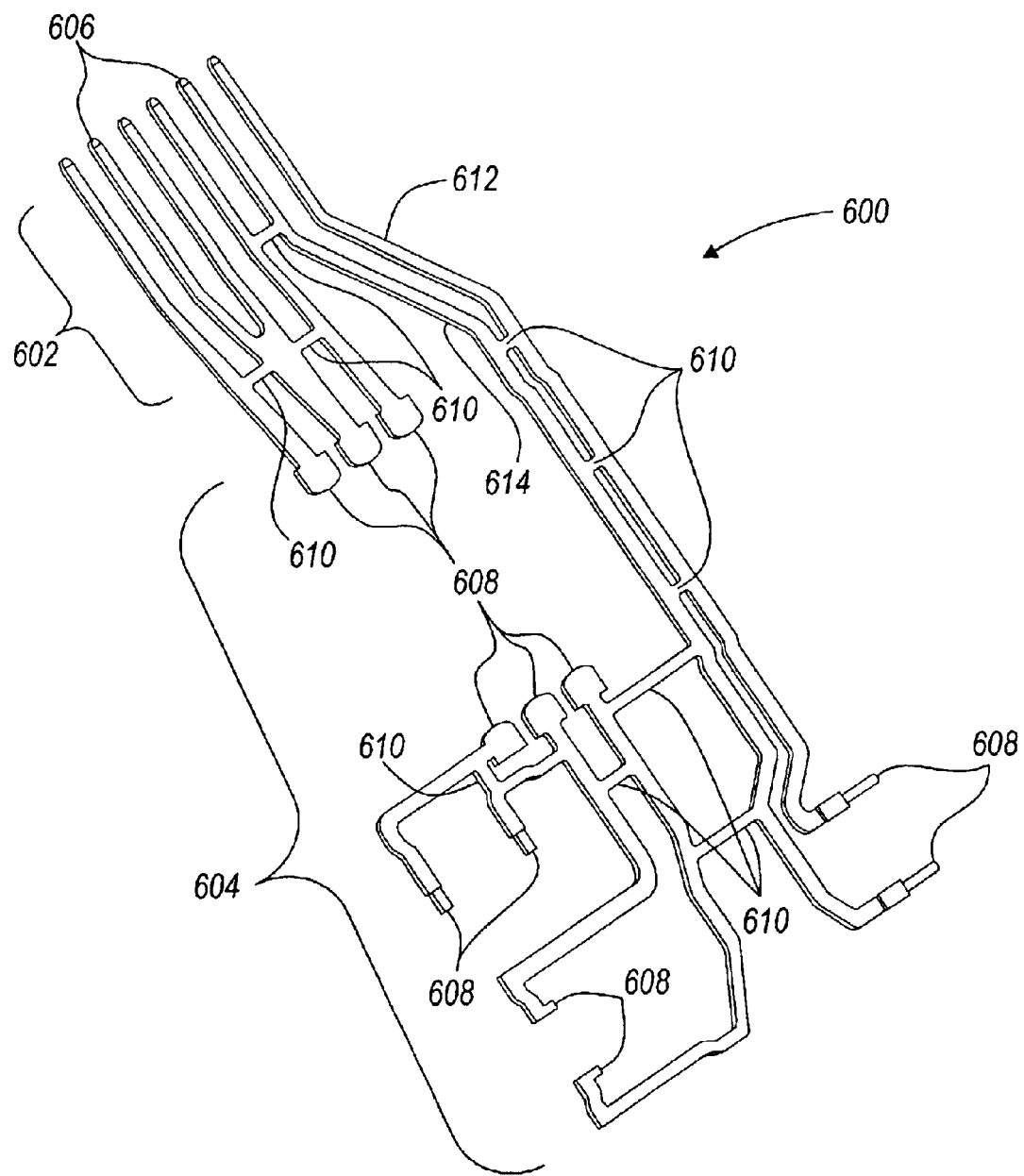
FIG. 10 is a perspective view of the lead frame, in accordance with the present invention.

Referring now to FIG. 10, a lead frame 600 for communicating electrical signals to and from electronic components mounted within the mass fluid flow sensor to electronic components mounted exterior of the sensor is illustrated, in accordance with the present invention. Lead frame 600 includes a connector pin portion 602 and an electrical device attachment portion 604. Connector pins 602 cooperate with a housing connector end portion 605 to form a male side of an electrical connector. Thus, portion 605 will cooperate with a female connector end portion and connector pins 606 will be inserted into the female connector end portion (not shown) as well known in the art.

Attachment portion 604 includes electrical contact tabs or pads 608 for connecting electrical devices such as integrated circuits and resistors, to lead frame 600. Preferably, lead frame 600 is held together prior to assembly into a sensor housing by lead frame stabilizing bars 610. During manufacture of the sensor, housing lead frame 600 is placed in a sensor housing mold (not shown) where an insert molding process is performed. After the housing has cured stabilizing bars 610 are severed creating distinct electrical paths.

Figure 11:
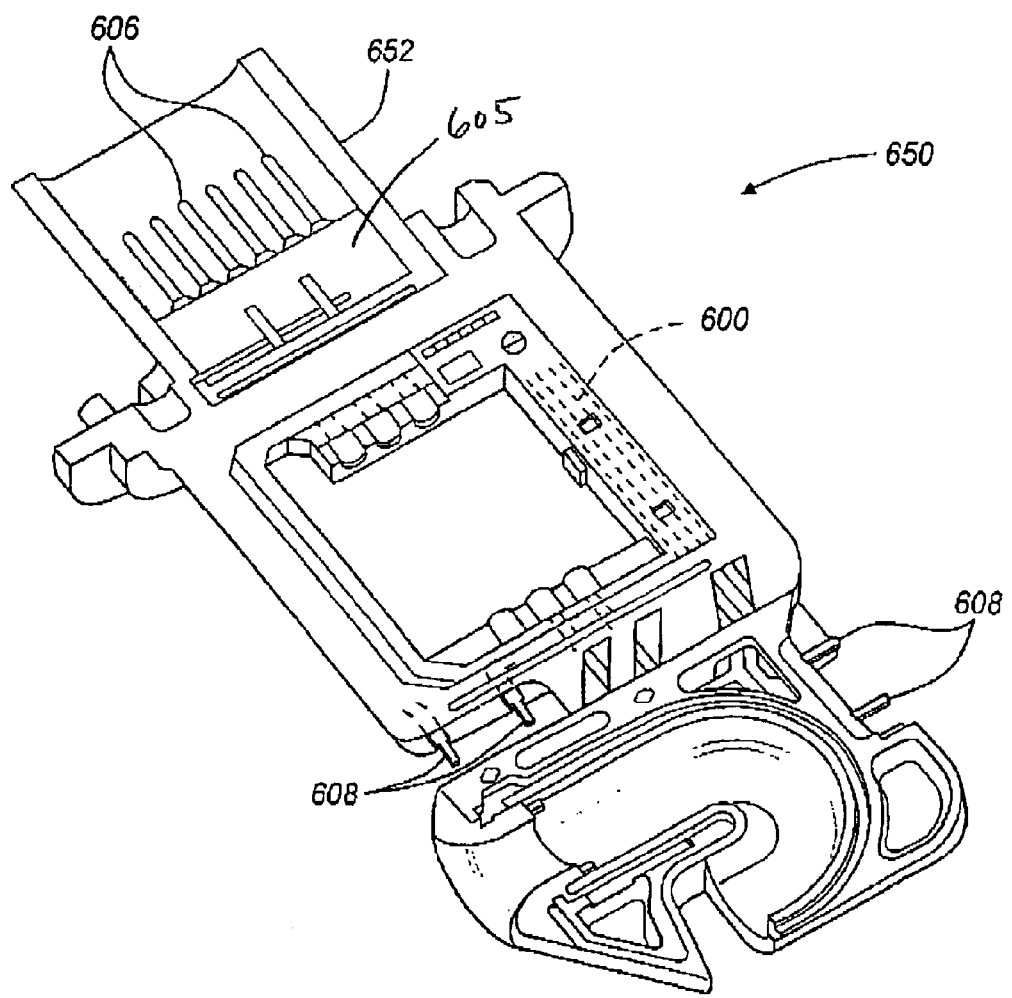
FIG. 11 is a cross-sectional view of the mass fluid flow sensor having the homogeneous lead frame disposed therein, in accordance with the present invention.

Referring now to FIG. 11, a cross-sectional view of a sensor housing 650 is illustrated having lead frame 600 insert molded therein, in accordance with the present invention. Connector pins 606 disposed in male connector end 652 electrically couple to a female connector end (not shown) in a conventional manner. One significant problem overcome by the present invention is the bending or damage to connector pins 606 during the insertion of connector end portion 605 into a female connector portion. The present invention provides a lead frame 600 made from a homogenous material having superior structural and corrosion resistance properties. For example, lead frame 600 is preferably made of stainless steel or similar material. Stainless steel provides enhanced structural stability to the connector pins 606. Moreover, a stainless steel lead frame 600 eliminates corrosion of the lead frame especially at the electrical attachment portions of the lead frame 608 that are exposed to corrosive environments.

Furthermore, lead frame 600 of the present invention is configured to provide increased overall housing structural stability. For example, a portion of lead frame 600 includes conductors 612 and 614 that extend longitudinally along the length of housing 650. This configuration provides increased structural stability along a longitudinal axis of housing 650. Advantageously, housing 650 of the present invention can withstand harsher environments where the housing is exposed to high acceleration or vibration fields.

The present invention contemplates other uses and applications for lead frame 600. For example, lead frame 600 may be used in other types of sensors and electronic modules. The lead frame 600 of the present invention is especially useful in sensors and electronic modules that are exposed to harsh and corrosive environments, such as an automotive environment where the sensor or electronic module is mounted to an exterior of a vehicle or within a vehicle engine compartment.

The foregoing discussion discloses and describes a preferred embodiment of the invention. One skilled in the art will readily recognize from such discussion, and from the accompanying drawings and claims, that changes and modifications can be made to the invention without departing from the true spirit and fair scope of the invention as defined in the following claims.

What is claimed is:

1. A device for detecting a mass of a flowing fluid, the device comprising:

a housing having a fluid sampling portion and a circuit cavity portion, wherein the fluid sampling portion is positionable within a fluid carrying duct and includes a flow passage:

a nozzle in fluid communication with the flow passage, wherein the nozzle has a nozzle exit;

an electrical element disposed in the flow passage proximate to the nozzle exit;

a circuit module in communication with the electrical element and disposed in the circuit cavity portion for detecting a change in an electrical property of the electrical element, wherein the detected change in the electrical property is used to determine the mass of the flowing fluid; and a hamogenous stainless steel lead frame having a connector pin portion and an electrical attachment portion for providing an electrical path from the electrical element and circuit module to the connector pin portion.

2. The device of claim 1 wherein the electrical element is positioned at the nozzle exit.

3. The device of claim 1 further comprising, a second electrical element disposed on the housing external of the flow passage.

4. The device of claim 1 wherein the nozzle exit has a diameter that is smaller than a diameter of the flow passage.

5. The device of claim 1 wherein a fluid bearing is created at a transition from the nozzle exit to the flow passage.

6. The device of claim 1 wherein the flow passage has a re-directional portion for re-directing the flowing fluid, the re-directional portion being semi-circular in shape.

7. The device of claim 6 wherein the flow passage has an expansion tube portion, the expansion tube portion having an expansion tube length such that at a maximum fluid flow speed, the fluid contacts an interior wall of the expansion tube portion prior to reaching the re-directional portion.

8. The device of claim 1 further comprising, a cover attachable to the housing for enclosing the fluid sampling portion and the circuit cavity portion.

9. The device of claim 1 further comprising, a heat sink in thermal communication with the circuit module for dissipating heat emanating from the circuit module.

10. The device of claim 1 further comprising, a wedge deflector integrally attached to the housing for creating a low pressure area at an outlet of the flow passage.

11. The device of claim 10 wherein a surface of the deflector is inclined at an angle between 47° and 60° with respect to a horizontal.

12. The device of claim 1 further comprising, a third electrical element disposed on the housing external of the flow passage.

13. The device of claim 12 wherein the third electrical element is used for determining a fluid temperature at the housing.

14. The device of claim 13 wherein the third electrical element is a thermistor.

15. A device for detecting a mass of a flowing fluid, the device comprising:

a housing having a fluid sampling portion and a circuit cavity portion, wherein the fluid sampling portion is positionable within a fluid carrying duct and includes a flow passage;

a nozzle in fluid communication with the flow passage, wherein the nozzle has a plurality of longitudinally converging elliptical side surfaces that terminate at a nozzle exit;

a first electrical element disposed in the flow passage at the nozzle exit;

a second electrical element supported by the housing external of the flow passage;

a circuit module in communication with the first and second electrical elements and disposed in the circuit cavity portion for detecting a change in an electrical property of the first and second electrical elements, wherein the detected change in the electrical property are used to determine the mass of the flowing fluid; and a homogenous stainless steel lead frame having a connector pin portion and an electrical attachment portion for providing an electrical path from the electrical element and circuit module to the connector pin portion.

16. The device of claim 15 wherein the flow passage is tubular.

17. The device of claim 15 wherein the nozzle exit has a diameter that is smaller then a diameter of the tubular flow passage.

18. The device of claim 15 further comprising, a cover attachable to the housing for enclosing the fluid sampling portion and the circuit cavity portion.

19. The device of claim 15 further comprising, a heat sink in thermal communication with the circuit module.

20. The device of claim 15 further comprising, a wedge deflector integrally attached to the housing for creating a low pressure area at an outlet of the flow passage.

21. The device of claim 20 wherein a surface of the deflector is inclined at an angle between 47° and 60° with respect to a horizontal.

22. The device of claim 15 further comprising, a third electrical element disposed on the housing external of the flow passage.

23. The device of claim 22 wherein the third electrical element is used for determining a fluid temperature at the housing.

24. The device of claim 23 wherein the third electrical element is a thermistor.

25. The device of claim 15 wherein a fluid bearing is created at a transition from the nozzle exit to the tubular flow passage.

26. The device of claim 15 wherein the tubular flow passage has a re-directional portion for re-directing the flowing fluid, the re-directional portion being semi-circular in shape.

27. The device of claim 26 wherein the tubular flow passage has an expansion tube portion, the expansion tube portion having an expansion tube length such that at a maximum fluid flow speed, the fluid contacts an interior wall of the expansion tube portion prior to reaching the re-directional portion.

* * * * *

UNITED STATES PATENT AND TRADEMARK OFFICE
CERTIFICATE OF CORRECTION

PATENT NO. : 6,845,661 B2
DATED : January 25, 2005
INVENTOR(S) : Leon Bogdanov et al.

It is certified that error appears in the above-identified patent and that said Letters Patent is hereby corrected as shown below:

Column 11,
Line 7, immediately after "passage" delete ":" (colon) and substitute -- ; -- (semicolon) in its place.
Line 18, delete "hamogenous" and substitute -- homogenous -- in its place.

Signed and Sealed this

Eleventh Day of October, 2005

JON W. DUDAS
*Director of the United States Patent and Trademark Office*